(12) United States Patent
Kwak et al.

(10) Patent No.: US 9,231,041 B2
(45) Date of Patent: Jan. 5, 2016

(54) ORGANIC LIGHT EMITTING DIODE DISPLAY DEVICE AND METHOD OF MANUFACTURING THE SAME

(71) Applicant: LG DISPLAY CO., LTD., Seoul (KP)

(72) Inventors: Sanghyeon Kwak, Paju-si (KR); Namwook Cho, Paju-si (KR); Bu Yeol Lee, Goyang-si (KR); Aram Shin, Seoul (KR)

(73) Assignee: LG Display Co., Ltd., Seoul (KR)

( * ) Notice: Subject to any disclaimer, the term of this patent is extended or adjusted under 35 U.S.C. 154(b) by 167 days.

(21) Appl. No.: 13/952,325

(22) Filed: Jul. 26, 2013

(65) Prior Publication Data
US 2014/0239264 A1 Aug. 28, 2014

(30) Foreign Application Priority Data
Feb. 28, 2013 (KR) .......................... 10-2013-0021882

(51) Int. Cl.
*H01L 51/52* (2006.01)
*H01L 27/32* (2006.01)

(52) U.S. Cl.
CPC ........ *H01L 27/3276* (2013.01); *H01L 27/3265* (2013.01)

(58) Field of Classification Search
CPC .................................................. H01L 51/5203
See application file for complete search history.

(56) References Cited

U.S. PATENT DOCUMENTS

| 6,104,461 A * | 8/2000 | Zhang et al. .................. 349/122 |
| 2005/0136578 A1 * | 6/2005 | Ohtani .......................... 438/179 |
| 2007/0252150 A1 * | 11/2007 | Yamazaki et al. ............. 257/66 |

* cited by examiner

*Primary Examiner* — Lex Malsawma
(74) *Attorney, Agent, or Firm* — Brinks Gilson & Lione

(57) ABSTRACT

Disclosed is an OLED display device. The OLED display device includes a metal line and a thin film transistor that are formed on a substrate, a first insulating layer formed on the metal line and the thin film transistor, a storage electrode formed on the first insulating layer, and connected to the metal line, a second insulating layer formed on the storage electrode, and an anode electrode formed on the second insulating layer to be connected to the thin film transistor and overlapping the storage electrode with the second insulating layer therebetween.

10 Claims, 6 Drawing Sheets

ORGANIC LIGHT EMITTING DIODE DISPLAY DEVICE AND METHOD OF MANUFACTURING THE SAME

CROSS-REFERENCE TO RELATED APPLICATIONS

This application claims priority to Korean Patent Application No.10-2013-0021882, filed on Feb. 28, 2013, the entirety of which is hereby incorporated by reference herein.

BACKGROUND

1. Field of the Invention

The present invention relates to an organic light emitting diode (OLED) display device and a method of manufacturing the same, and more particularly, to an OLED display device with high resolution and a method of manufacturing the same.

2. Discussion of the Related Art

With the advance of information display devices that are light and have excellent portability, the advance of the information society is accelerating. As a representative type of flat panel display device that is thin in thickness, liquid crystal display (LCD) devices were already commercialized and replaced cathode ray tube (CRT) display devices, and OLED display devices are attracting much attention as next generation flat panel display devices. Since the OLED display devices do not use a separate light source such as a backlight applied to the LCD devices, the OLED display devices have a thin thickness and a good color reproduction rate compared to the LCD devices, thus realizing a sharp image. Also, the OLED display devices have a wide viewing angle, a good contrast ratio, a fast response time, and low power consumption.

FIG. 1 is a sectional view illustrating a portion of a related art OLED display device.

As illustrated in FIG. 1, the related art OLED display device includes a substrate 110, a thin film transistor Tr, a first storage electrode 122, a second storage electrode 133, a planarization layer 140, an anode electrode 150, and a bank layer 160.

First, the thin film transistor Tr is formed on the substrate 110. The thin film transistor Tr includes a semiconductor layer 111, a first gate insulating layer 120, a gate electrode 121, a second gate insulating layer 130, a source electrode 131, and a drain electrode 132.

The semiconductor layer 111 and the first gate insulating layer 120 are sequentially formed on the substrate 110, and the gate electrode 121 is formed on the semiconductor layer 111. The first storage electrode 122 and the gate electrode 121 are simultaneously formed on the first gate insulting layer 120, namely, on the same layer. The second gate insulating layer 130 insulating the gate electrode 121 is formed on the gate electrode 121. A plurality of contact holes are formed in the first and second gate insulating layers 120 and 130 to partially expose the semiconductor layer 111, and then the source electrode 131 and drain electrode 132 respectively connected to the exposed portions of the semiconductor layer 111 are formed on the second gate insulating layer 130, namely, on the same layer. Also, the second storage electrode 133 is formed in an area corresponding to the first storage electrode 122 simultaneously with the source electrode 131 and the drain electrode 132. Subsequently, the anode electrode 150 connected to the drain electrode 132 is formed, and the bank layer 160 defining a contact area (i.e., an emitting area) between the anode electrode 150 and the organic emitting layer (not shown) is formed.

In this case, the first storage electrode 122 formed simultaneously with the gate electrode 121 and the second storage electrode 133 formed simultaneously with the source electrode 131 and drain electrode 132 generate a capacitance, thereby enabling the organic emitting layer to hold a light emitting state during one frame. However, the first storage electrode 122 may be replaced by doping the semiconductor layer 111. Also, the above-described example uses a top gate type, but the storage electrodes Cst may be formed in the same type independent of various types, such as a bottom gate type or a double gate type, of the thin film transistor Tr.

Since the storage electrodes Cst of the related art OLED display device are all formed simultaneously with some elements of the thin film transistor Tr, the storage electrodes Cst are restrictively formed in only an area, in which the thin film transistor Tr is not formed, in a pixel area. In this case, a design freedom of the storage electrode Cst is reduced by the thin film transistor Tr. Furthermore, the storage electrode Cst should be formed to have a certain area or more for generating a certain capacitance that holds a light emitting state of the organic emitting layer during one frame. Therefore, a pixel size is inevitably enlarged for forming the storage electrode Cst (limited in design freedom) occupying a certain area or more, causing a reduction in resolution.

SUMMARY

Accordingly, the present invention is directed to provide an OLED display device and a method of manufacturing the same that substantially obviate one or more problems due to limitations and disadvantages of the related art.

An aspect of the present invention is directed to provide an OLED display device with a reduced pixel size and high resolution.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting diode (OLED) display device, comprising: a metal line and a thin film transistor that are disposed on a substrate; a first insulating layer disposed on the metal line and the thin film transistor; a storage electrode disposed on the first insulating layer, and electrically connected to the metal line; a second insulating layer form disposed on the storage electrode; and an anode electrode disposed on the second insulating layer to be connected to the thin film transistor, and overlapping the storage electrode with the second insulating layer therebetween.

According to another aspect of the present invention, there is provided a method of manufacturing an organic light emitting diode (OLED) display device, comprising: forming a metal line and a thin film transistor on a substrate; forming a first insulating layer on the metal line and the thin film transistor; patterning the first insulating layer to expose the metal line and the thin film transistor; forming a storage electrode on the first insulating layer to be connected to the metal line; forming a second insulating layer to cover the first insulating layer, the storage electrode and the exposed thin film transistor; patterning the second insulating layer to expose the thin film transistor; and forming an anode electrode on the second insulating layer to be connected to the thin film transistor, the anode electrode overlapping the storage electrode with the second insulating layer formed in-between.

According to another aspect of the present invention there is provided a method of manufacturing an organic light emitting diode (OLED) display device, comprising: forming a metal line and a thin film transistor on a substrate; forming a first insulating layer on the metal line and the thin film transistor; forming a storage electrode on the first insulating layer; forming a second insulating layer to cover the first insulating layer and the storage electrode; patterning the second insulating layer and the first insulating layer to expose the metal line, the storage electrode, and the thin film transistor; forming a link line on the second insulating layer which links the exposed storage electrode to the exposed metal line; and forming an anode electrode on the second insulating layer to be connected to the thin film transistor which has been exposed, the anode electrode overlapping the storage electrode with the second insulating layer therebetween.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 1:
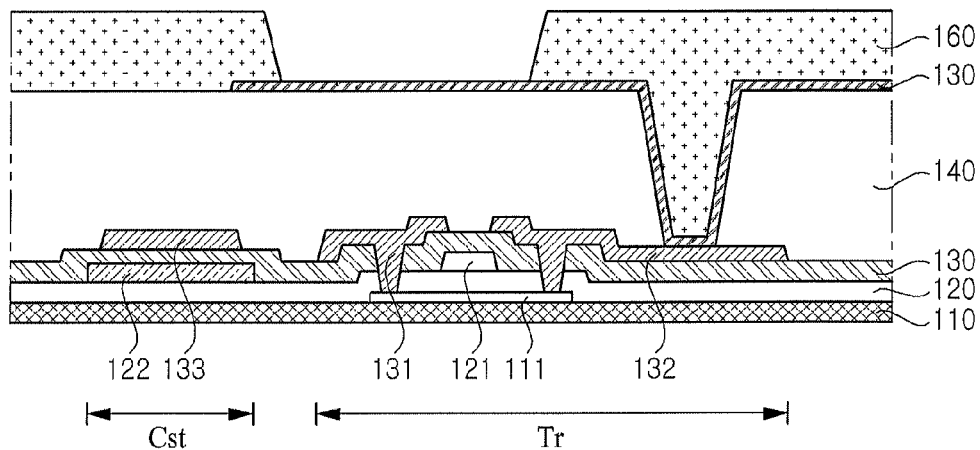
FIG. 1 is a sectional view illustrating a portion of a related art OLED display device.
Figure 2:
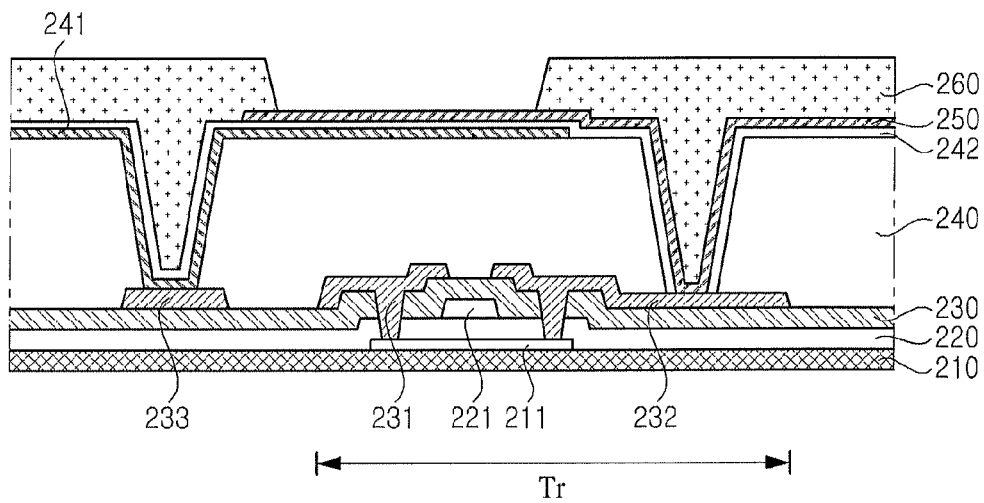
FIG. 2 is a sectional view illustrating an OLED display device according to an embodiment of the present invention.

FIG. 2 is a sectional view illustrating an OLED display device according to an embodiment of the present invention.

As illustrated in FIG. 2, the OLED display device according to an embodiment of the present invention includes a substrate 210, a thin film transistor Tr, a metal line 233, a first insulating layer 240, a storage electrode 241, a second insulating layer 242, an anode electrode 250, and a bank layer 260.

First, the thin film transistor Tr is formed on the substrate 210. The thin film transistor Tr includes a semiconductor layer 211, a first gate insulating layer 220, a gate electrode 221, a second gate insulating layer 230, a source electrode 231, and a drain electrode 232.

Although only the thin film transistor Tr connected to the anode electrode 250 is illustrated in the drawing, in addition to the thin film transistor Tr, a plurality of thin film transistors may be further formed for configuring a compensation circuit.

In order to form the thin film transistor Tr, first, the semiconductor layer 211 and the first gate insulating layer 220 are sequentially formed on the substrate 210. The gate electrode 221 is formed on the first gate insulating layer 220 corresponding o the semiconductor layer 211. The second gate insulating layer 230 is formed on the gate electrode 221 so as to insulate the gate electrode 221, and the source electrode 231 and the drain electrode 232 are formed on the second gate insulating layer 230. In order for the source electrode 231 and the drain electrode 232 to be connected to the semiconductor layer 211, the source electrode 231 and the drain electrode 232 may be respectively connected to portions of the semiconductor layer 211 which are exposed by patterning the first and second gate insulating layers 220 and 230.

Subsequently, the metal line 233 may be formed on the same layer as the thin film transistor Tr formed as described above. The metal line 233, as illustrated in FIG. 2, may be formed of the same material as the source electrode 231 and the drain electrode 232, or formed of the same material as the gate electrode 221. When the metal line 233 is formed of the same material as the source electrode 231 and the drain electrode 232, the metal line 233 may receive a voltage from a power line or a data line, or when the metal line 233 is formed of the same material as the gate electrode 221, the metal line 233 may receive a voltage from a gate line. The metal line 233 may receive a voltage as described above, and transfer the voltage to the storage electrode 241 for holding a light emitting state of an organic emitting layer (not shown) during one frame.

In the related art OLED display devices, the metal line 233 acts as one of electrodes configuring a storage electrode of the related art, but, in the present invention, since the metal line 233 is connected to the storage electrode 241 to transfer a voltage, a space having a certain area or more is not needed. Therefore, the metal line 233 may be formed to be connected to the storage electrode 241 in a spare space off a side of the thin film transistor Tr irrespective of a formation area. Thus, only the thin film transistor is provided in a layout space according to the present invention, thus minimizing a layout area. In contrast, the related art OLED display device includes both the thin film transistor and the storage electrode in a similar layout space. Accordingly, a pixel size can be more reduced than the related art, thus realizing high resolution, in the present invention.

The storage electrode 241 is generally used as the term referring to two electrodes that generate a capacitance. However, in the present invention, the anode electrode 250 acts as one of the two electrodes, and thus, it is specified that the storage electrode 241 is not separately referred to by Cst in the drawing, and only an additional metal line which is connected to the metal line 233 to overlap the anode electrode 250 is referred to as the storage electrode 241.

The thin film transistor Tr of FIG. 2 is illustrated in a top gate type, but is not limited thereto. In the present invention, the thin film transistor Tr may be implemented in various types such as a bottom gate type or a double gate type, in addition to the top gate type. Accordingly, the metal line 233 may be formed of the same material as a metal area of the thin film transistor Tr having one of the various types.

Subsequently, the first insulating layer 240 is formed on the thin film transistor Tr and the metal line 233. The first insulating layer 240 may be formed of an organic material to cover the thin film transistor Tr and the metal line 233 and planarize an entire surface of the substrate 210. The organic material may include a photoacryl-based, epoxy-based, or imide-based polymer having a good planarization characteristic. However, the first insulating layer 240 is not limited to the material, and may be formed of an inorganic material or various insulating materials.

Subsequently, the storage electrode 241 connected to the metal line 233 is formed on the first insulating layer 240. The storage electrode 241 is formed to overlap the anode electrode 250 on the first insulating layer 240. Also, the storage electrode 241 may be formed to directly contact the metal line 233 which is partially or overall exposed by patterning the first insulating layer 240. Since elements other than the storage electrode 241 are not formed on the first insulating layer 240, a design freedom is enhanced, and thus, the storage electrode 241 can be formed to have a sufficient broad area even without any change or with a reduction in pixel size.

Subsequently, the second insulating layer 242 is formed on the storage electrode 241. The second insulating layer 242 acts as a dielectric disposed between the storage electrode 241 and the anode electrode 250 that generate a capacitance. The capacitance is proportional to an area (in which the storage electrode 241 and the anode electrode 250 face each other) and a permittivity of the second insulating layer 242 acting as the dielectric, and is inversely proportional to an interval between the storage electrode 241 and the anode electrode 250. The interval between the storage electrode 241 and the anode electrode 250 may be equal to a thickness of the second insulating layer 242, and thus, the capacitance is inversely proportional to the thickness of the second insulating layer 242. That is, as the second insulating layer 242 becomes thinner in thickness, the capacitance may increase. Therefore, the thickness of the second insulating layer 242 may be less than that of the first insulating layer 240. The second insulating layer 242 may be formed of an inorganic material such as silicon oxide to have a thickness of about 1,000 Å to 3,000 Å, and the first insulating layer 240 may be formed of a planarizing material such as photoacryl to have a thickness of 1 µm or more.

Moreover, the second insulating layer 242 may be formed to overall cover the first insulating layer 240. The second insulating layer 242 is formed all over the substrate 210, and, even when the second insulating layer 242 is patterned to bring the later-formed anode electrode 250 into contact with the thin film transistor Tr, the second insulating layer 242 is patterned with the second insulating layer 242 overall covering the first insulating layer 240, thereby forming the second insulating layer 242 to overall cover the first insulating layer 240. Accordingly, the second insulating layer 242 prevents penetration of moisture through a side and a bottom, thus protecting the later-formed organic emitting layer (not shown).

Subsequently, the anode electrode 250 is formed on the second insulating layer 242. The anode electrode 250 is disposed in an area overlapping the storage electrode 241. The overlapping area may partially or overall match an emitting area of the organic emitting layer. Also, the anode electrode 250 faces the storage electrode 241 with the second insulating layer 242 therebetween, and the anode electrode 250 and the storage electrode 241 generate a sufficient amount of capacitance for holding the light emitting state of the organic emitting layer during one frame.

The anode electrode 250 is connected to a portion of the thin film transistor Tr that is exposed by patterning the first and second insulating layers 240 and 242.

The bank layer 260 defining an emitting area is formed on the anode electrode 250, and the organic emitting layer (not shown) and a cathode electrode (not shown) may be further formed on the bank layer 260.

Figure 3:
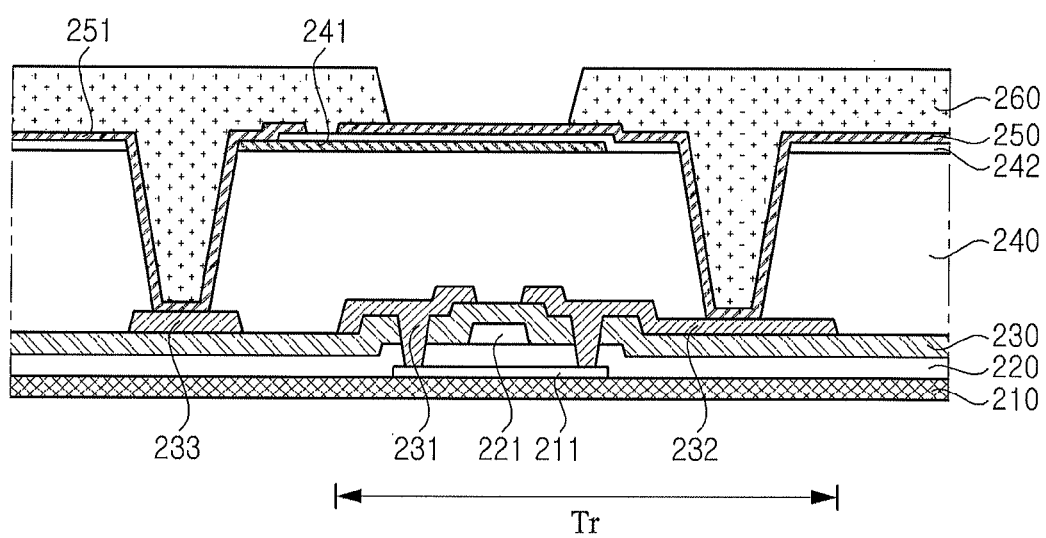
FIG. 3 is a sectional view illustrating an OLED display device according to another embodiment of the present invention.

FIG. 3 is a sectional view illustrating an OLED display device according to another embodiment of the present invention.

As illustrated in FIG. 3, the OLED display device according to another embodiment of the present invention includes a substrate 210, a thin film transistor Tr, a metal line 233, a first insulating layer 240, a storage electrode 241, a second insulating layer 242, a anode electrode 250, and a bank layer 260, and further includes a link line 251.

First, the thin film transistor Tr, the metal line 233, and the first insulating layer 240 are formed on the substrate 210 identically to the embodiment of FIG. 2. Then, a storage electrode 241 is formed on the first insulating layer 240, but the storage electrode 241 is not directly connected to the metal line 233 but is connected to the metal line 233 through the separately formed link line 251.

Subsequently, the second insulating layer 242 is formed on the first insulating layer 240 and the storage electrode 241. The link line 251 is formed on the second insulating layer 242, the metal line 233 and the storage electrode 241, which are exposed by the patterning the first and second insulating layers 240 and 242, to link the metal line 233 and the storage electrode 241. Thus, the link line 251 may directly contact the metal line 233 to be connected to the storage electrode 241.

The anode electrode 250 is formed on the second insulating layer 242. The anode electrode 250 is connected to a portion of the thin film transistor Tr that is exposed by patterning the second insulating layer 240 and the first insulating layer 242. The anode electrode 250 may be formed of the same material as the link line 251.

The anode electrode 250 is formed to overlap the storage electrode 241, and the anode electrode 250 and the storage electrode 241 face each other with the second insulating layer 242 therebetween to generate a capacitance. The overlapping area may be broadly designed to generate a sufficient capacitance, and may partially or overall match the emitting area of the organic emitting layer.

FIGS. 4A to 4D are sectional views illustrating a method of manufacturing an OLED display device according to an embodiment of the present invention.

Figure 4A:
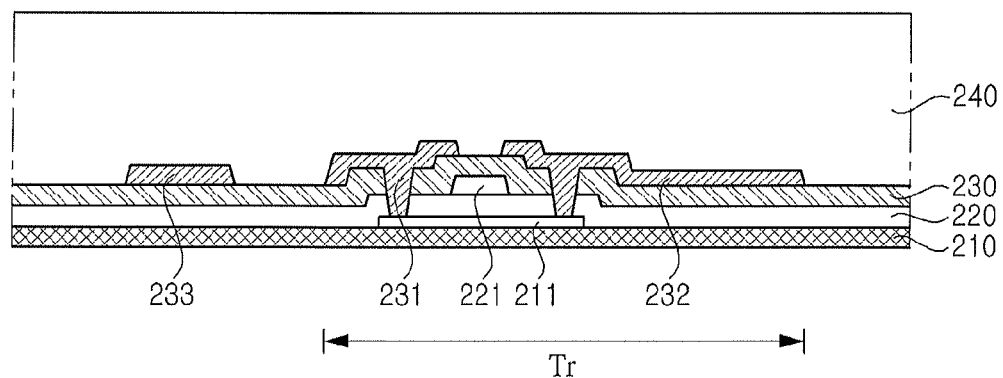
FIGS. 4A to 4D are sectional views illustrating a method of manufacturing an OLED display device according to an embodiment of the present invention.

First, as illustrated in FIG. 4A, the thin film transistor Tr is formed on the substrate 110. The thin film transistor Tr may include the semiconductor layer 211, the first gate insulating layer 220, the gate electrode 221, and the second gate insulating layer 230.

The semiconductor layer 211, the first gate insulating layer 220, the gate electrode 221, and the second gate insulating layer 230 are sequentially formed for forming the thin film transistor Tr on the substrate 210. The first and second gate insulating layers 220 and 230 may be formed of a silicon oxide-based inorganic material or organic material, and, when the first and second gate insulating layers 220 and 230 are formed of an inorganic material, a layer thickness may be about 1,000 Å to 3,000 Å.

The gate electrode 221 is formed to overlap the semiconductor layer 211, for applying a gate signal to the semiconductor layer 211. Then, the semiconductor layer 211 is exposed by patterning the first and second insulating layer 220 and 230, and the source electrode 231 and the drain electrode 232 are formed on the second gate insulating layer 230 to be respectively connected to the exposed portions of the semiconductor layer 211.

The metal line 233 is formed on the second gate insulating layer 230. The metal line 233 may be formed simultaneously with the source electrode 231 and the drain electrode 232. The metal line 233 may be formed in a layout space which remains after the thin film transistor Tr is formed, irrespective of a formation area. Thus, the metal line 233 may be formed to have the minimum area. Accordingly, a pixel size can be minimized, thus realizing high resolution.

Subsequently, the first insulating layer 240 is formed on the thin film transistor Tr and the metal line 233. The first insulating layer 240 may be formed of an organic material. The organic material may include a photoacryl-based, epoxy-based, or imide-based polymer having a good planarization characteristic. When the first insulating layer 240 is formed of an organic material, the first insulating layer 240 may be formed to a thickness of 1 μm or more for planarizing a lower structure. However, the first insulating layer 240 is not limited to the material, and may be formed of an inorganic material or various insulating materials.

Figure 4B:
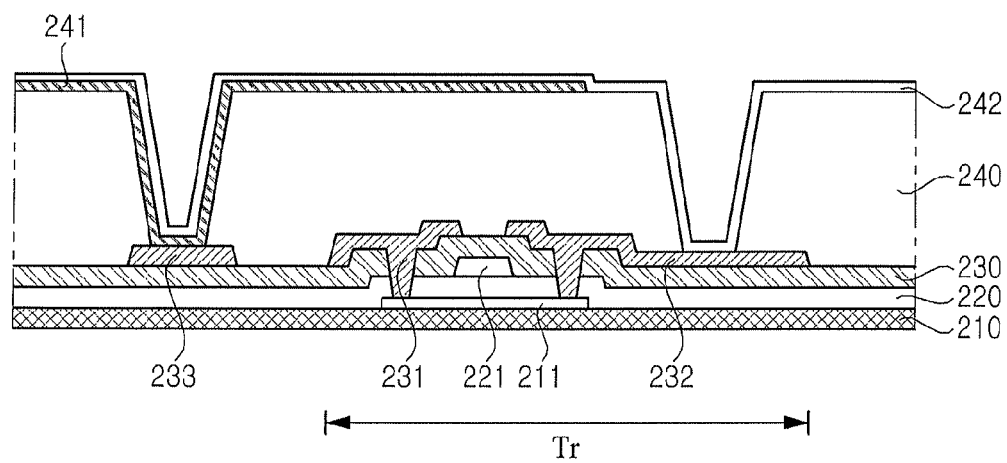

Subsequently, as illustrated in FIG. 4B, the metal line 233 and the thin film transistor Tr are exposed by patterning the first insulating layer 240. In the thin film transistor Tr, especially, the drain electrode 232 may be exposed. Then, the storage electrode 241 may be formed on the second insulating layer 242 to be connected to the exposed metal line 233. The storage electrode 241 may be formed to overlap the anode electrode 250 to be formed later, and the storage electrode 241 and the anode electrode 250 may generate a capacitance. The storage electrode 241 may be formed in an area corresponding to an emitting area which is opened by the bank layer 260.

Subsequently, the second insulating layer 242 is formed all over the substrate 210. The second insulating layer 242 may be formed to a thickness of 1,000 Å to 3,000 Å for generating a sufficient capacitance. Also, the second insulating layer 242 may be formed all over the substrate 210 to cover the storage electrode 241 and the first insulating layer 240, and, although not shown in FIG. 4B, the second insulating layer 242 may cover up to a side of the first insulating layer 240. Accordingly, the second insulating layer 242 can prevent penetration of moisture through the bottom and side of the organic emitting layer (not shown) to be formed later. Penetration of moisture through a top of the organic emitting layer (not shown) can be prevented by an encapsulating part (not shown) to be formed on the organic emitting layer.

Figure 4C:
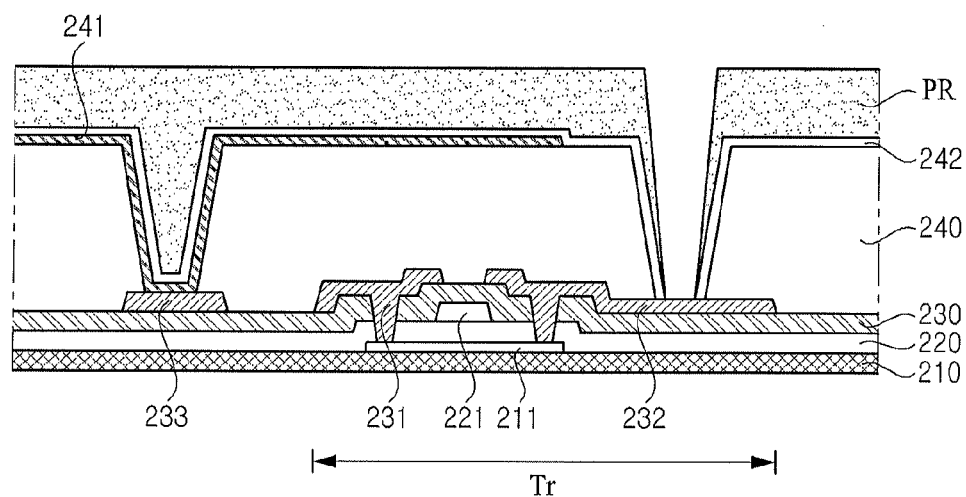

Subsequently, as illustrating in FIG. 4C, the thin film transistor Tr is again exposed by patterning only an area of the second insulating layer 242 directly contacting the thin film transistor Tr. Here, the again exposed area of the thin film transistor Tr, especially, may be the drain electrode 232.

A photoresist PR is deposited all over the second insulating layer 242, and then the photoresist PR in an area corresponding to the second insulating layer 242 directly contacting the thin film transistor Tr is removed by an exposure process and a development process. Thus, only an area of the second insulating layer 242 directly contacting the thin film transistor Tr is exposed to the outside. Subsequently, the exposed second insulating layer 242 is patterned through dry etching.

As described above, the reason that etches only the second insulating layer 242 directly contacting the thin film transistor Tr is for maintaining a state, in which the second insulating layer 242 overall covers the first insulating layer 240, during the dry etching process because the first insulating layer 240 is damaged by a gas used for the dry etching when the first insulating layer 240 is formed of an organic material.

For this reason, after the second insulating layer 242 is formed, the first and second insulating layers 240 and 242 should be patterned by an additional photolithography process instead of a single photolithography process. Accordingly, a width removed by patterning the first insulating layer 240 may be greater than a width removed by patterning the second insulating layer 242.

Figure 4D:
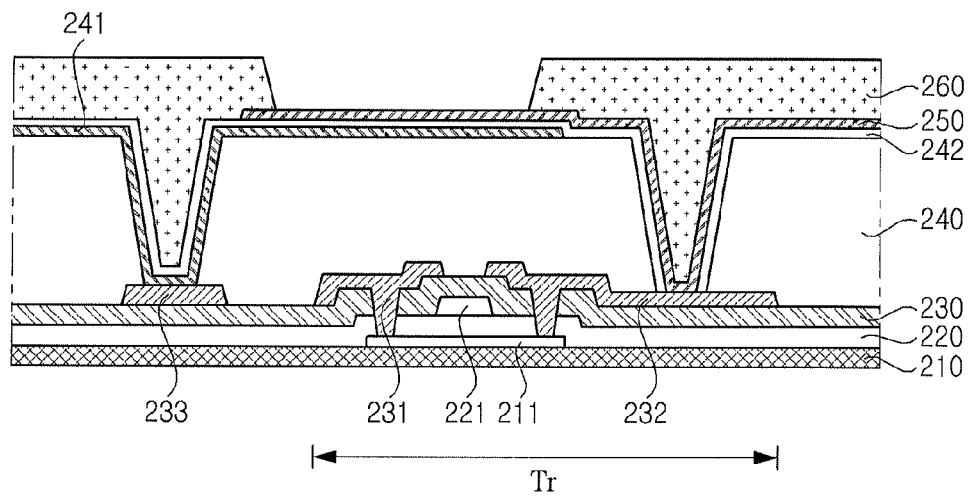

Subsequently, as illustrated in FIG. 4D, the anode electrode 250 is formed on the second insulating layer 242 to contact the again exposed area of the thin film transistor Tr and overlap the storage electrode 241. Then, the bank layer 260 is formed on the anode electrode 250 to define the emitting area.

FIGS. 5A to 5D are sectional views illustrating a method of manufacturing an OLED display device according to another embodiment of the present invention.

Figure 5A:
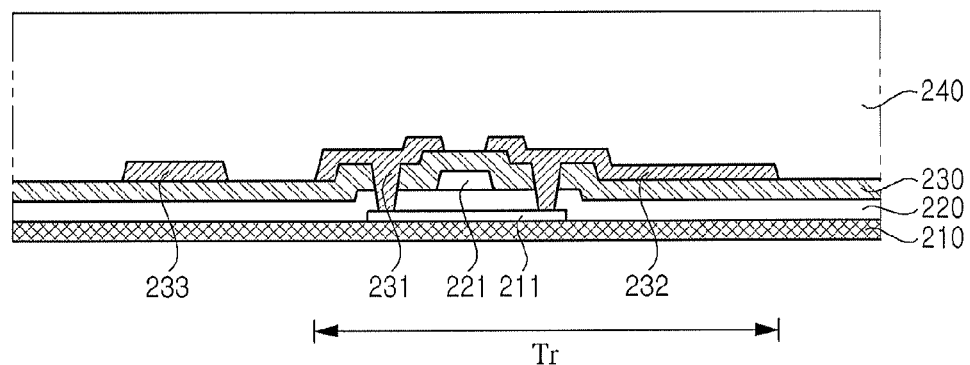
FIGS. 5A to 5D are sectional views illustrating a method of manufacturing an OLED display device according to another embodiment of the present invention.

First, as illustrated in FIG. 5A, the thin film transistor Tr, the metal line 233, and the first insulating layer 240 are formed on the substrate 210. The thin film transistor Tr may include the semiconductor layer 211, the first gate insulating layer 220, the gate electrode 221, and the second gate insulating layer 230. A process of forming the thin film transistor Tr, the metal line 233, and the first insulating layer 240 is the same as the description of FIG. 4A, and thus, its description is not provided.

Figure 5B:
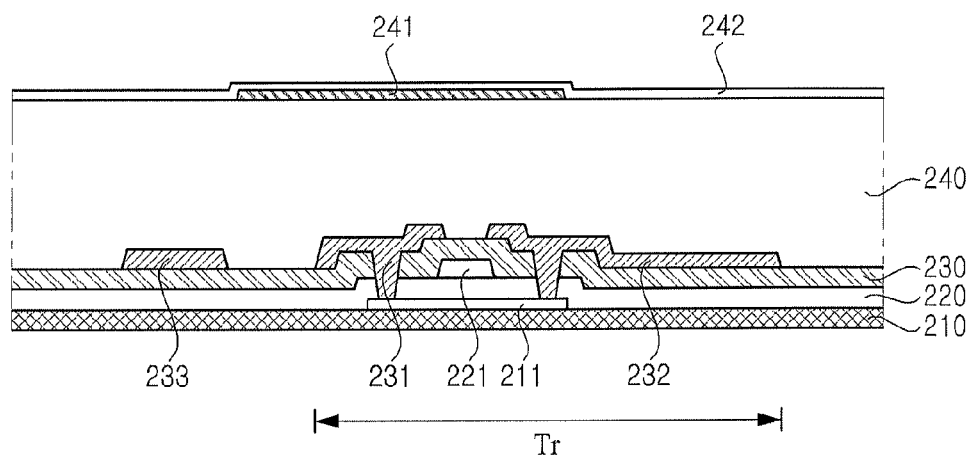

Subsequently, as illustrated in FIG. 5b, the storage electrode 241 is formed on the first insulating layer 240. The storage electrode 241 is formed to overlap the anode electrode 250 to be formed later.

Subsequently, the second insulating layer 242 may be formed all over the substrate 210 to cover the storage electrode 241. Although not shown in FIG. 5B, the second insulating layer 242 is formed to overall cover up to the side of the first insulating layer 240, and can prevent penetration of moisture through the bottom and side of the organic emitting layer (not shown) to be formed on the second insulating layer 242.

Figure 5C:
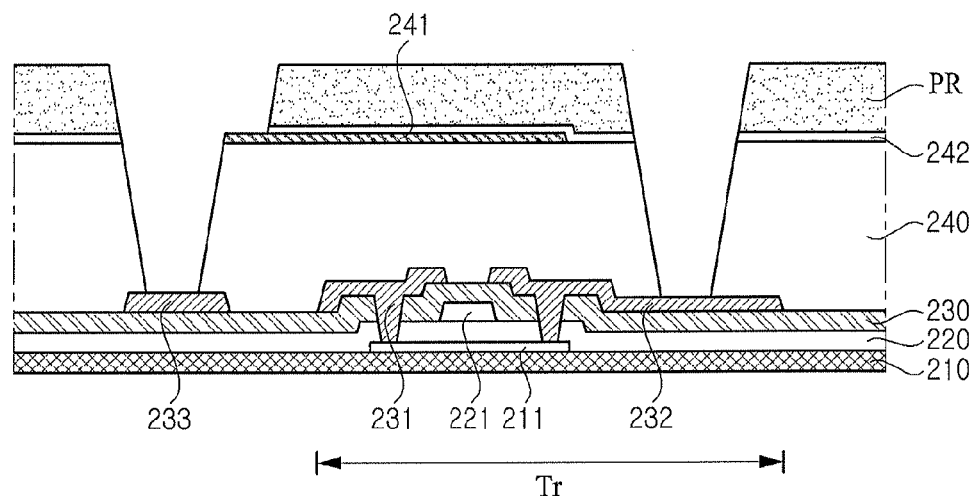

Subsequently, as illustrated in FIG. 5C, the photoresist PR is deposited on the second insulating layer 242, and then a partial area of the thin film transistor Tr, especially, the photoresist PR in an area corresponding to the drain electrode 232 and an area corresponding to the metal line 233 is removed by the exposure process and the development process. Subsequently, the thin film transistor Tr, the storage electrode 241, and the metal line 233 are exposed by successively patterning the second insulating layer 242 and the first insulating layer 240 using a residual photoresist PR as an etching mask. The second insulating layer 242 and the first insulating layer 240 may be patterned by a dry etching process.

Figure 5D:
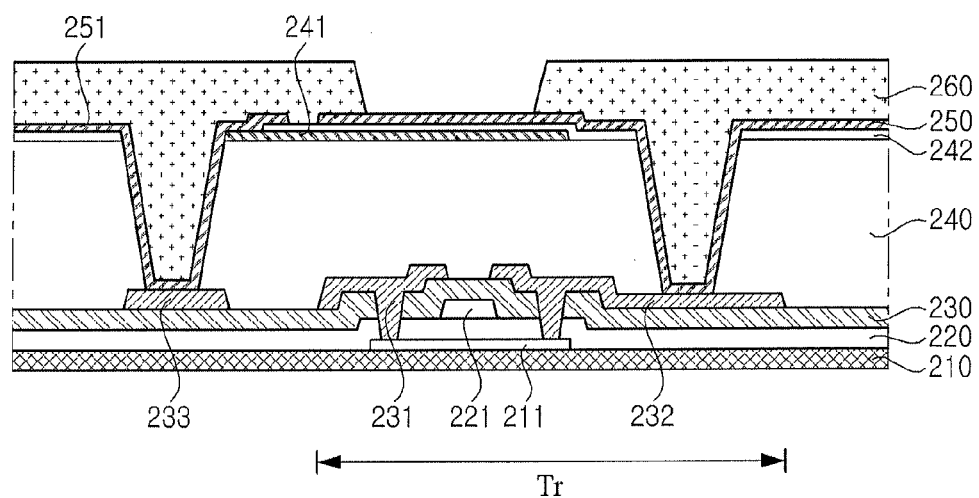

Subsequently, as illustrated in FIG. 5D, the link line 251 is formed on the second insulating layer 242, the metal line 233 and the storage electrode 241. The anode electrode 250 is formed to be connected to the exposed portion of the thin film transistor Tr. The anode electrode 250 is formed to overlap the storage electrode 241 with the second insulating layer 242 therebetween. Also, the link line 251 connecting the exposed metal line 233 and the exposed storage electrode 241 is formed apart from the anode electrode 250. The anode electrode 250 and the link line 251 may be formed simultaneously.

As described above, in the embodiment, the thin film transistor Tr, the storage electrode 241, and the metal line 233 are simultaneously exposed by patterning the second insulating layer 242 and the first insulating layer 240 in the single photolithography process, thereby reducing the number of photolithography processes by one compared to the preceding embodiment.

According to the present invention, the storage electrode occupying the greatest area in the pixel structure of the OLED display device is formed on the thin film transistor, and the storage electrode and the anode electrode generates a capacitance with a separate insulating layer therebetween, thus enhancing a design freedom of the storage electrode and reducing a pixel size.

Moreover, according to the present invention, by reducing a pixel size, the OLED display device can realize high resolution.

Moreover, according to the present invention, the separate insulating layer is formed all over the substrate, thus preventing penetration of moisture through a side.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting diode (OLED) display device, comprising:
   a metal line and a thin film transistor that are disposed on a substrate;
   a first insulating layer disposed on the metal line and the thin film transistor;
   a storage electrode disposed on the first insulating layer, and electrically connected to the metal line;
   a second insulating layer form disposed on the storage electrode; and
   an anode electrode disposed on the second insulating layer to be connected to the thin film transistor, and overlapping the storage electrode in a thickness direction of the OLED display, which is vertical to a main surface of the substrate, with the second insulating layer therebetween.

2. The OLED display device of claim 1, wherein the metal line is disposed on the substrate as part of a same layer as at least one of a source, drain or gate of the thin film transistor.

3. The OLED display device of claim 1, wherein the storage electrode is electrically connected to the metal line via direct connection.

4. The OLED display device of claim 1, wherein the storage electrode is electrically connected to the metal line via a link line that is directly connected to the metal line.

5. The OLED display device of claim 4, wherein the link line is disposed, at least in part, as a same layer as the anode electrode.

6. The OLED display device of claim 1, wherein the second insulating layer is disposed between the anode electrode and the storage electrode in an overlapping area, such that a gate electrode comprising the thin film transistor is positioned to overlap with at least a portion of the overlapping area.

7. The OLED display device of claim 6, wherein the overlapping area also overlaps, at least in part, with a light emitting region.

8. The OLED display device of claim 1, wherein the second insulating layer is disposed to cover all of the storage electrode.

9. The OLED display device of claim 1, wherein the second insulating layer is disposed between the anode electrode and the storage electrode in order to generate a capacitance region such that the capacitance region overlaps with a gate electrode comprising the thin film transistor.

10. The OLED display of claim 9, wherein a thickness of the second insulating layer is less than a thickness of the first insulating layer.

* * * * *